(12) United States Patent
Slaby et al.

(10) Patent No.: US 10,928,867 B2
(45) Date of Patent: Feb. 23, 2021

(54) COOLING DISTRIBUTION UNIT FLOW RATE

(71) Applicant: HEWLETT PACKARD ENTERPRISE DEVELOPMENT LP, Houston, TX (US)

(72) Inventors: Matthew Slaby, Houston, TX (US); Aaron Childers, Houston, TX (US); Tuong Tran, Houston, TX (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 147 days.

(21) Appl. No.: 15/889,840

(22) Filed: Feb. 6, 2018

(65) Prior Publication Data

US 2019/0243430 A1    Aug. 8, 2019

(51) Int. Cl.
*G06F 1/20* (2006.01)

(52) U.S. Cl.
CPC .............. *G06F 1/20* (2013.01); *G06F 1/206* (2013.01); *G06F 2200/201* (2013.01)

(58) Field of Classification Search
CPC ...... G06F 1/20; G06F 1/206; G06F 2200/201; H05K 7/2079; H05K 7/20836
See application file for complete search history.

(56) References Cited

U.S. PATENT DOCUMENTS

| | | | |
|---|---|---|---|
| 7,808,780 B2 | 10/2010 | Brunschwiler et al. | |
| 8,297,069 B2 | 10/2012 | Novotny et al. | |
| 8,430,156 B2 | 4/2013 | Malone et al. | |
| 9,148,982 B2 | 9/2015 | Campbell et al. | |
| 9,655,282 B2 | 5/2017 | Barringer et al. | |
| 2011/0317367 A1* | 12/2011 | Campbell | H05K 7/203 361/700 |
| 2014/0362527 A1* | 12/2014 | Best | G06F 1/20 361/679.53 |
| 2016/0003561 A1 | 1/2016 | Casper et al. | |
| 2016/0298883 A1* | 10/2016 | Louvar | H05K 7/20827 |
| 2017/0086334 A1 | 3/2017 | Riddle | |
| 2017/0181321 A1* | 6/2017 | Shelnutt | H05K 7/20763 |
| 2017/0219241 A1* | 8/2017 | Magcale | H05K 7/20836 |
| 2017/0374761 A1* | 12/2017 | Zimmerman, Sr. | H05K 7/20272 |

FOREIGN PATENT DOCUMENTS

WO    WO-2011149023 A1 *  12/2011    ......... H05K 7/20836

OTHER PUBLICATIONS

Machine Translation of WO-2011149023-A1 by espacenet, all description (Year: 2011).*
Coolcentric; "Coolcentric Coolant Distribution Units," retrieved on Sep. 14, 2017, 2 pages, http://www.coolcentric.com/Products/CoolantDistributionUnits.aspx.

* cited by examiner

*Primary Examiner* — Filip Zec
(74) *Attorney, Agent, or Firm* — Hewlett Packard Enterprise Patent Department

(57) ABSTRACT

In some examples, a system may include a plurality of cooling distribution units (CDUs) to control cooling of a plurality of computing devices based in part on average differential pressure between a supply and return for each of the plurality of CDUs, temperature of coolant in a loop flowing between each of the plurality of CDUs and computing devices, and facility valve position for each of the plurality of CDUs, wherein one CDU of the plurality of the CDUs is nominated lead CDU and broadcasts flow rate to the plurality of CDUs to follow.

20 Claims, 4 Drawing Sheets

COOLING DISTRIBUTION UNIT FLOW RATE

BACKGROUND

A cooling distribution unit (CDU) may control and provide cooling for computing devices. Coolant may flow through a facility line. The facility line may travel from a facility coolant storage area to a heat exchanger of the CDU and back to the facility water storage area. Coolant may flow through a secondary line. The secondary line may travel from the heat exchanger to computing devices and back to the heat exchanger. The heat exchanger transfers heat from the secondary line to the facility line.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

A cooling distribution unit (CDU) may control and provide cooling for computing devices. Coolant may flow through a facility line. The facility line may travel from a facility coolant storage area to a heat exchanger of the CDU and back to the facility coolant storage area. Coolant may flow through a secondary line. The secondary line may travel from the heat exchanger to computing devices and back to the heat exchanger. The heat exchanger transfers heat from the secondary line to the facility line.

Examples described herein may utilize a plurality of CDUs to perform load balancing based in part on a facility valve's position. The CDU may include a pump for a secondary line, a facility valve, temperature sensors, a processing resource, and other components to control cooling or other various aspects of the CDU. Each CDU may be the same or similar. Each CDU may include the capability to be a lead CDU and to nominate a lead CDU. The lead CDU may broadcast flow rate for each CDU to follow. The lead CDU may adjust and broadcast the flow rate to maintain an average differential pressure for a supply and return of the secondary line for each of the plurality of CDUs. In such examples, the secondary line may be a common line for the plurality of CDUs. Each CDU may monitor the supply temperature of a secondary line. Each CDU may adjust facility valve position based on the supply temperature of the secondary line. The temperature of coolant supplied to the secondary line may indicate a high or low load on the computing devices and thus on the CDU itself. The CDU may increase or decrease the flow rate based on the facility valve position to an offset of the broadcast flow rate. In response to the lead CDU experiencing a higher or lower load, the lead CDU may adjust its own flow rate and/or the broadcasted flow rate.

Accordingly, various examples described herein may include a system comprising a plurality of CDUs to control cooling of a plurality of computing devices based in part on average differential pressure between a supply and return for each of the plurality of CDUs, temperature of coolant in a loop flowing between each of the plurality of CDUs and computing devices, and facility valve position for each of the plurality of CDUs, wherein one CDU of the plurality of the CDUs is nominated leader CDU and broadcasts flow rate to the plurality of CDUs to follow.

Figure 1:
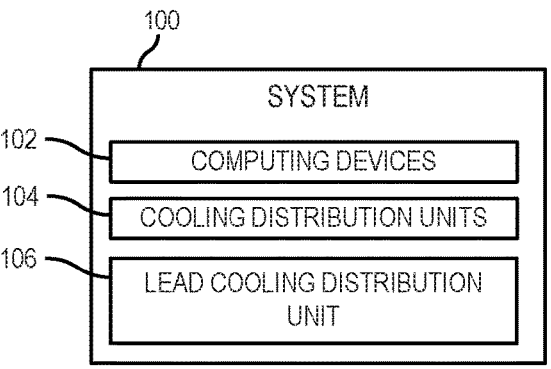
FIG. 1 is a block diagram of a system to provide cooling for computing devices including cooling distribution units (CDUs) and a lead CDU.

FIG. 1 is a block diagram of a system 100 to provide cooling for computing devices 102 including CDUs 104 and a lead CDU 106. System 100 may include a plurality of CDUs 104. Each of the plurality of CDUs 104 may monitor various aspects of each CDU 104. In an example, each of the plurality of CDUs 104 may include a heat exchanger, a pump controlling flow rate on a secondary line, and a facility valve. Each of the plurality of CDUs 104 may monitor and control the facility valve position. The system 100 may include a lead CDU 106 from the plurality of CDUs 104. Each of the plurality of CDUs 104 may nominate a lead CDU 106. Each of the plurality of CDUs 104 may include the ability to perform as a lead CDU 106. The lead CDU 106 may broadcast a flow rate for the plurality of CDUs 104 to follow. Each of the plurality of CDUs 104 may adjust the local broadcast flow rate to an offset of the broadcasted flow rate, the offset based in part on each of the plurality of CDUs 104 facility valve position.

As used herein, a "computing device" may be a storage array, storage device, storage enclosure, server, desktop or laptop computer, computer cluster, node, partition, virtual machine, a CDU, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any machine-readable storage medium described herein may be non-transitory.

As used herein, "coolant" may be water, nitrogen, propylene glycol, mineral oil, refrigerant, dielectric, or some combination thereof. A line, such as the secondary line or facility line, may carry the coolant through the CDU, the facility storage area, the computing devices, or some combination thereof. The line may be a pipe or duct.

In another example, the plurality of CDUs 104 may control cooling based in part on an average differential pressure between a supply and return for each of the plurality of CDUs 104. In such examples, each of the plurality of CDUs 104 may measure the differential pressure of the supply and return for the secondary line of the system. In other words, a CDU may measure the pressure at the supply of the secondary line and at the return of the secondary line. The CDU may take the difference of the measurements. The differential pressure may be the difference. Each of the plurality of CDUs 104 may provide the differential pressure to the lead CDU 106. The lead CDU 106 may calculate an average differential pressure. The lead CDU 106 may adjust the broadcasted flow rate to maintain the average differential pressure. In another example, the average differential pressure may be a given or known value. In such examples, the lead CDU 106 may monitor the differential pressure of each of the plurality of CDUs 104 (including the lead CDUs 106 differential pressure), rather than each of the plurality of CDUs 104 calculating differential pressure.

In another example, each of the plurality of CDUs 104 may monitor the temperature of the supply of the secondary line. In response to a higher than normal temperature, a CDU may adjust the facility valve position of the CDU. In a further example, the CDU may also measure the facility valve position periodically, at specified time intervals, or after the facility valve position is updated. The CDU may adjust the CDUs flow rate based on the facility valve position. For example, in response to the facility valve position being in an upper range, the CDU may decrease the CDUs flow rate by an offset. In such examples, the upper range may be sixty percent open or greater. In other examples, the upper range may be any value greater than fifty percent or some other value specified by the lead CDU 160 or a user. In another example, in response to the facility valve position being in a lower range, the CDU may increase the CDUs flow rate by an offset. In such examples, the lower range may be forty percent open or lower. In other examples, the lower range may be any value less than fifty percent or some other value specified by the lead CDU 160 or a user. In an example, the offset may be set by the lead CDU 106. In another example, the offset may be a preset value or a user set value. For example, the offset may be a value of plus or minus fifteen percent.

In an example, the normal temperature may be a set temperature. The lead CDU 106 may set the temperature for each of the plurality of CDUs 104 to check the supply of the secondary line against. In another example, a user may set the temperature. In another example, the set temperature may be preset. For example, the temperature set point may be twenty five degrees Celsius. If the supply of the secondary line of any of the plurality of CDUs 104 falls below twenty five degrees Celsius, the affected CDU may adjust flow rate, as described above. The facility valve position may be adjusted accordingly based on a closed-loop control (e.g. PID) from a given temperature set point.

In another example, each of the plurality of CDUs 104 may include the same capabilities. In another example, each of the plurality of CDUs 104 may be nominated as the lead CDU 106. In an example, in response to the lead CDU 106 failing or no longer in communication, each of the plurality of CDUs 104 may elect or nominate a new lead CDU. In an example, a CDU may self-nominate to become lead CDU 106, based on last known lead CDU 106 number and the CDU number sequentially, in such a way that there is only one lead CDU 106 per the plurality of CDUs 104.

Figure 2:
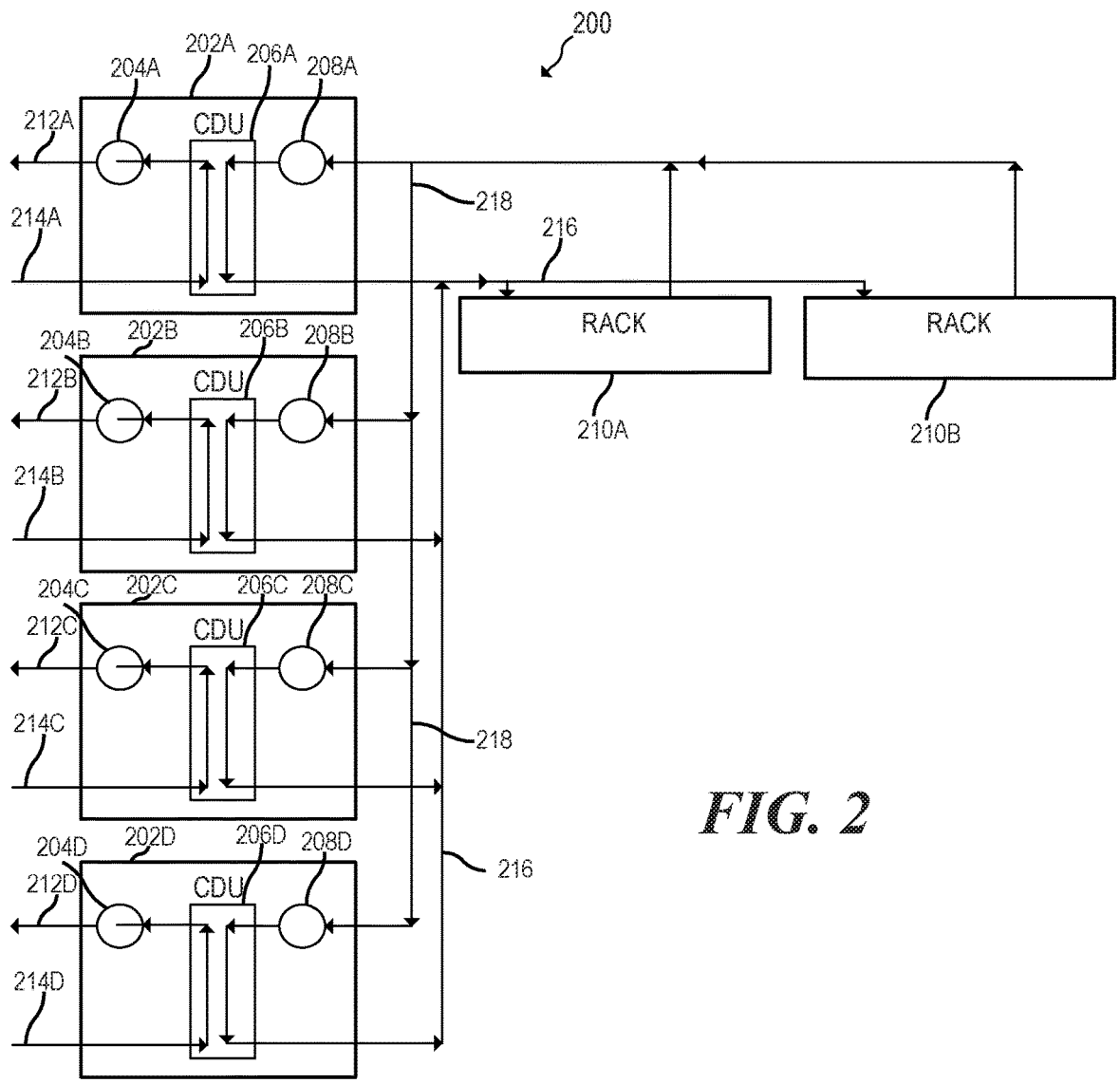
FIG. 2 is a block diagram of a system including CDUs and racks.

FIG. 2 is a block diagram of a system 200 including CDUs 202 and racks 210. The racks 210 may contain various computing devices (not shown). For example, the rack 210A may include a plurality of servers compatible with the CDUs 202 and rack 210B may include a plurality of servers compatible with the CDUs 202. Each CDU 202 may include a heat exchanger 206. The heat exchanger 206 may cool coolant returning from the racks 210 with coolant from a facility line. The coolant may return via a secondary line return 218. The secondary line supply 216 may provide the cooled coolant to the racks 210. The facility line may include a return 212 and supply 214.

Each CDU may include a facility valve 204 and a secondary line pump 208. The secondary line pump 208 may control the flow rate of the coolant through the secondary line. The secondary line pump 208 may also include a sensor to measure the flow rate through the secondary line. The facility valve 204 may control the percentage of the opening of the facility line. The facility valve 204 may include a sensor to measure the percentage that the facility valve 204 is open. The CDU 202 may include sensors at the secondary return, the secondary supply, or both in the heat exchanger to measure temperature of the coolant, as well as to measure differential pressure.

In an example, the CDUs 202 may nominate a lead CDU (for example, CDU 202A). The lead CDU (e.g., CDU 202A) may request the differential pressure of each of the CDUs (for example, CDU 202B, 202C, and 202D). In another example, the average differential pressure may be a preset value. Based on the average differential pressure for the plurality of CDUs 202, the lead CDU (e.g., CDU 202A) may set a flow rate. The lead CDU (e.g., CDU 202A) may then broadcast the set flow rate. Each of the CDUs (e.g., CDU 202B, 202C, and 202D) may set the flow rate for the CDUs respective pump (e.g., secondary line pump 208B, 208C, and 208D). In response to a temperature increase or decrease, a CDU (for example, CDU 202B) may lower or raise, respectively, the facility valve (for example, facility valve 204B) position. In response to the adjustment of the facility valve (e.g., facility valve 204B) position, the CDU (e.g., CDU 202B) may re-adjust the flow rate by an offset, as described above.

In another example, the system 200 may include four CDUs 202, as illustrated. In another example, the system 200 may include at least two CDUs 202. In another example, the system 200 may include greater than four CDUs 202. Regardless of the amount of CDUs 202 included, all CDUs 202 may communicate with every other CDU 202 and CDUs 202 may normally follow the lead CDUs 202 broadcasted flow rate, depending on the facility valve 204 position, as described.

Figure 3:
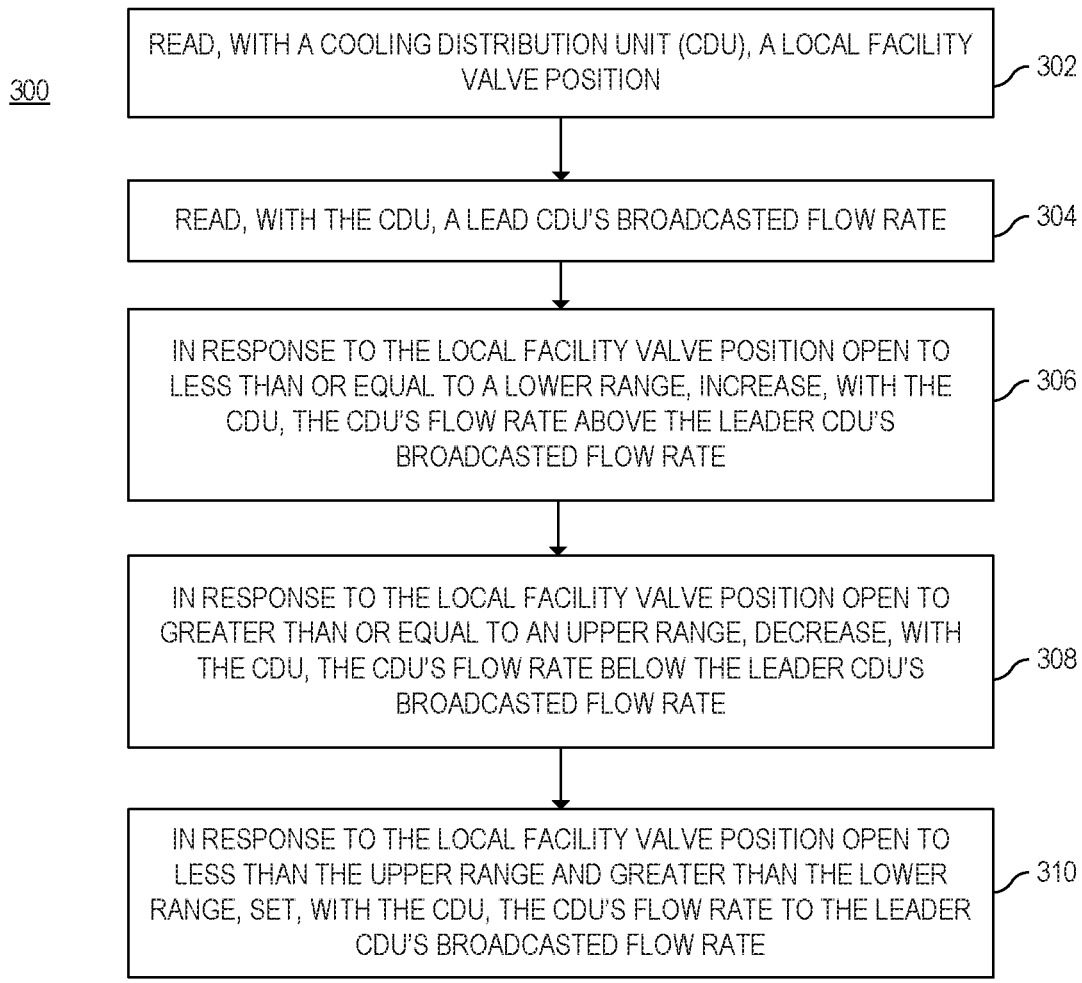
FIG. 3 is a flowchart of a method to adjust a CDU's flow rate based on local facility valve position and a broadcasted flow rate.

FIG. 3 is a flowchart 300 of a method to adjust a CDU's flow rate based on local facility valve position and a broadcasted flow rate. Although execution of method 300 is described below with reference to the system 200 of FIG. 2, other suitable systems or modules may be utilized, including, but not limited to, system 100 or computing device 500. Additionally, implementation of method 300 is not limited to such examples.

At block 302, a CDU (for example, CDU 202C) may read a local facility valve (for example, facility valve 204C) position. In other words, the CDU (e.g. CDU 202C) may include a facility line for facility coolant. The CDU (e.g. CDU 202C) may include a facility valve (e.g., facility valve 204C) for the facility line. The facility valve (e.g., facility valve 204C) may open or close, allowing for more or less coolant, respectively, to flow through the CDU (e.g. CDU 202C). The facility valve (e.g., facility valve 204C) may include a sensor. The sensor may indicate the position of the facility valve (e.g., facility valve 204C). In a further example, the sensor may measure the percentage that the facility valve (e.g., facility valve 204C) is open. As noted, the sensor may provide the value as a percentage. The CDU (e.g. CDU 202C) may include a microcontroller. The microcontroller may read the value given by the sensor on the facility valve (e.g., facility valve 204C).

At block 304, the CDU (e.g. CDU 202C) may read a broadcasted flow rate. A lead CDU (e.g. CDU 202A) may broadcast a flow rate. The lead CDU (e.g. CDU 202A) may set the flow rate to maintain an average differential pressure between the supply 216 and return 218 of each of the plurality of CDUs 202, including the lead CDU (e.g. CDU 202A), in the system. Each CDU 202 may be communicatively connected. In other words, the microcontroller of each CDU 202 may be connected. The CDUs 202 may communicate various factors to each other. For example, each CDU 202 may send flow rate, coolant temperature, and/or differential pressure to the lead CDU (e.g. CDU 202A). In another example, each CDUs 202 microcontroller may communicate the various factors to each other CDUs 202 microcontrollers. The lead CDU (e.g. CDU 202A) may calculate the average differential pressure based on these values. In another example, the lead CDU's (e.g. CDU 202A) microcontroller may calculate the average differential pressure based on these values. In response to the lead CDU (e.g. CDU 202A) setting or broadcasting a flow rate to each CDU 202, each CDU 202, or each CDU's 202 microcontroller, may read the broadcast value.

At block 306, in response to the local facility valve (e.g., facility valve 204C) position open to less than or equal to a lower range, the CDU (e.g. CDU 202C) may increase the CDUs (e.g. CDU 202C) flow rate above the leader CDUs (e.g. CDU 202A) broadcasted flow rate. The CDU (e.g. CDU 202C) may read local facility valve (e.g., facility valve 204C) position and the broadcasted flow rate, as described above. The CDU (e.g. CDU 202C) may have a pre-set lower range for facility valve (e.g., facility valve 204C) position. In another example, the CDU (e.g. CDU 202C) may set the lower range. Further, a user may set the lower range. In another example, the CDU (e.g. CDU 202C) may automatically set the lower range based on various factors. In another example, the lower range may be equal to or lesser than forty percent. In another example the lower range may start at a lower (for example, thirty percent) or higher (for example, forty five percent) percentage. In an example, the lead CDU (e.g. CDU 202A) may broadcast the offset. In another example, each CDU 202 may set the offset. In another example, a user may set the offset. In another example, the CDU (e.g., CDU 202C) may set the flow rate to fifteen percent greater than the broadcasted flow rate. In other examples, the CDU (e.g., CDU 202C) may set the flow rate to some other value less than or greater than fifteen percent greater than the broadcasted flow rate. In another example, the CDUs (e.g., CDU 202C) microcontroller may perform the functions described above.

In another example, the facility valve (e.g., facility valve 204C) position may indicate the load on the CDU (e.g., CDU 202C). In another example, when the coolant at the supply of the secondary line is cooler than normal or a set point temperature, the load may be considered light. In other word, the temperature at the supply of the secondary line of a CDU (e.g., CDU 202C) may be cooler than a temperature set by the lead CDU (e.g., CDU 202A). In such examples, since the supply coolant may be cooler than normal, the CDU (e.g., CDU 202C) may normally lower the facility valve (e.g., facility valve 204C) opening percentage. Further, other CDUs 202 may be heavily loaded. In such examples, the CDU (e.g., CDU 202C), or the CDU's (e.g., CDU 202C) microcontroller, may open the facility valve (e.g., facility valve 204C) more (instead of less) and set the CDUs (e.g., CDU 202C) flow rate to a value at an offset above the broadcasted flow rate. This means coolant travels through the heat exchanger (e.g., 206C) faster, but the coolant may cool down faster as coolant through the supply (e.g., 214C) of the facility line increases. Thus, the overall system 200 maintains average differential pressure.

At block 308, in response to the local facility valve (e.g., facility valve 204C) position open to greater than or equal to an upper range, the CDU (e.g., CDU 202C) may decrease the CDUs (e.g., CDU 202C) flow rate below the leader CDUs (e.g., CDU 202A) broadcasted flow rate. The CDU (e.g., CDU 202C) may read local facility valve (e.g., facility valve 204C) position and the broadcasted flow rate, as described above. The CDU (e.g., CDU 202C) may have a pre-set upper range for the facility valve (e.g., facility valve 204C) position. In another example, the CDU (e.g., CDU 202C) may set the upper range. Further, a user may set the upper range. In another example, the CDU (e.g., CDU 202C) may automatically set the upper range based on various factors. In another example, the upper range may be greater than or equal to sixty percent. In another example the upper range may start at a lower (for example, fifty five percent) or higher (for example, seventy percent) percentage. In an example, the lead CDU (e.g. CDU 202A) may broadcast the offset. In another example, each CDU 202 may set the offset. In another example, a user may set the offset. In another example, the CDU (e.g., CDU 202C) may set the flow rate to fifteen percent less than the broadcasted flow rate. In other examples, the CDU (e.g., CDU 202C) may set the flow rate to some other value less than or greater than fifteen percent less than the broadcasted flow rate. In another example, the CDUs (e.g., CDU 202C) microcontroller may perform the functions described above.

In another example, the facility valve (e.g., facility valve 204C) position may indicate the load on the CDU (e.g., CDU 202C). In another example, when the coolant at the supply of the secondary line is hotter than normal or a set point temperature, the load may be considered heavy. In such examples, since the supply coolant may be hotter than normal, the CDU (e.g., CDU 202C) may normally increase the facility valve opening. Further, other CDUs 202 may be lightly loaded. In such examples, the CDU (e.g., CDU 202C), or CDU's (e.g., CDU 202C) microcontroller, may close the facility valve (e.g., facility valve 204C) more and set the CDUs (e.g., CDU 202C) flow rate to a value at an offset below the broadcasted flow rate. This means coolant travels through the heat exchanger slower, so coolant has more time to cool. Thus, the overall system 200 maintains average differential pressure.

At block 310, in response to the local facility valve (e.g., facility valve 204C) position open to less than the upper range and greater than the lower range, the CDU (e.g., CDU 202C) may set the CDUs (e.g., CDU 202C) flow rate to the broadcasted flow rate. In an example, the CDUs (e.g., CDU 202C) broadcasted flow rate may already match the broadcasted flow rate. In such examples, the CDUs (e.g., CDU 202C) may maintain the current flow rate. In another example, the CDUs (e.g., CDU 202C) flow rate may not match the broadcasted flow rate. In such examples, the CDUs (e.g., CDU 202C) may set its flow rate to the broadcasted flow rate. In another example, the CDUs (e.g., CDU 202C) microcontroller may perform the functions described above.

Figure 4:
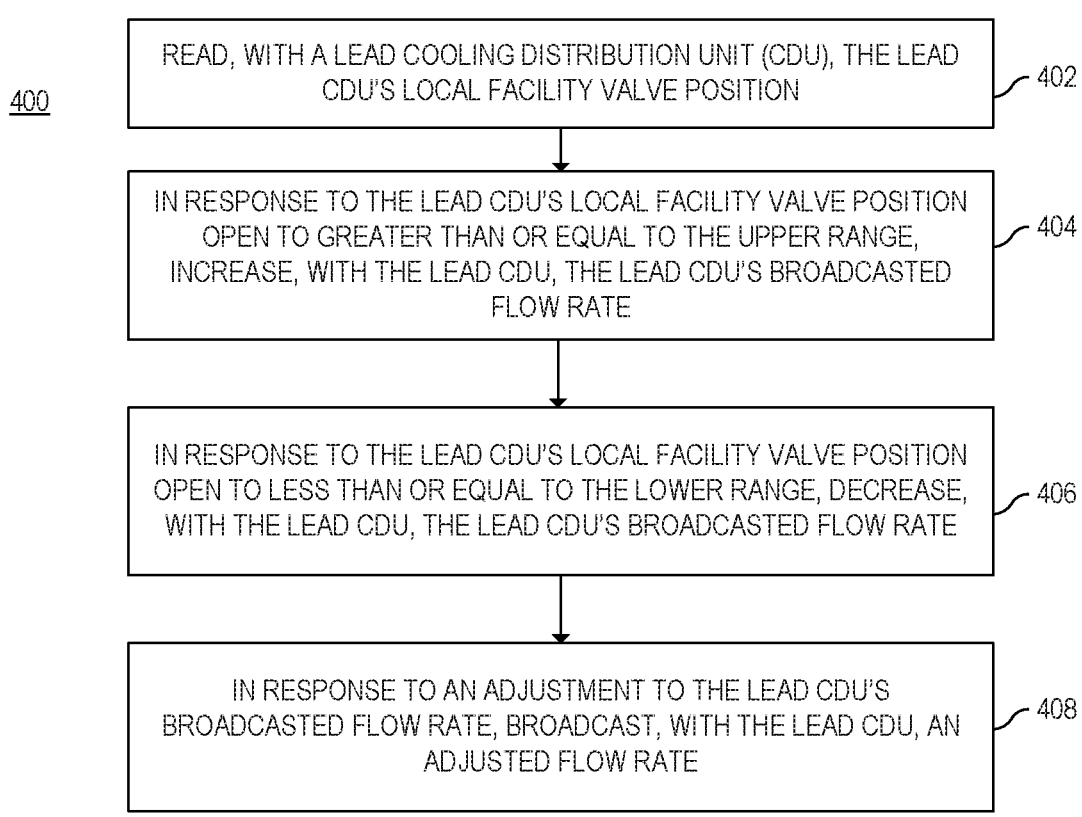
FIG. 4 is a flowchart of a method to adjust a lead CDU's broadcasted flow rate based on local facility valve position.

FIG. 4 is a flowchart 400 of a method to adjust a lead CDUs (e.g., CDU 202A) broadcasted flow rate based on local facility valve (e.g., facility valve 204A) position. Although execution of method 400 is described below with reference to the system 200 of FIG. 2, other suitable systems or modules may be utilized, including, but not limited to, system 100 or computing device 500. Additionally, implementation of method 400 is not limited to such examples.

At block 402, the lead CDU (e.g., CDU 202A), or CDU's (e.g., CDU 202A) microcontroller, may read the lead CDUs (e.g., CDU 202A) local facility valve (e.g., facility valve 204A) position. As described above a CDU 202 may read a local facility valve 204 position. The lead CDU (e.g., CDU 202A) may also read local facility valve (e.g., facility valve 204A) position, to determine flow rates and assist in maintaining average differential pressure.

At block 404, in response to the lead CDUs (e.g., CDU 202A) local facility valve (e.g., facility valve 204A) position open to greater than or equal to the upper range, the lead CDU (e.g., CDU 202A), or lead CDU's (e.g., CDU 202A) microcontroller, may increase the broadcasted flow rate. In an example, the higher the facility valve is open, the more load the CDU (e.g., CDU 202A) may be under. In another example, the lead CDU (e.g., CDU 202A), or lead CDU's (e.g., CDU 202A) microcontroller, may store the broadcasted flow rate. In another example, the lead CDU (e.g., CDU 202A) may adjust broadcasted flow rate based on various factors. Factors may include average differential pressure, the lead CDUs (e.g., CDU 202A) local facility valve (e.g., facility valve 204A) position, and the temperature of the lead CDUs (e.g., CDU 202A) secondary line supply 216.

In an example, once the lead CDU (e.g., CDU 202A), or lead CDU's (e.g., CDU 202A) microcontroller, determines that the lead CDUs (e.g., CDU 202A) local facility valve (e.g., facility valve 204A) position is opened to above the upper range, the lead CDU (e.g., CDU 202A), or lead CDU's (e.g., CDU 202A) microcontroller, may adjust the broadcasted flow rate to a greater value. In another example, the lead CDU (e.g., CDU 202A), or lead CDU's (e.g., CDU 202A) microcontroller, may increase the broadcasted flow rate by an offset value. The lead CDU (e.g., CDU 202A), or lead CDU's (e.g., CDU 202A) microcontroller, may also adjust the lead CDUs (e.g., CDU 202A) flow rate to a level lower than the new broadcasted flow rate. The lower level may be an offset. The offset may be set by the lead CDU (e.g., CDU 202A) or a user. The offset may be a pre-set value. The offset may be a value calculated by the lead CDU (e.g., CDU 202A), or lead CDU's (e.g., CDU 202A) microcontroller, based on various factors, including average differential pressure, the lead CDUs (e.g., CDU 202A) valve position, and the temperature of the lead CDU (e.g., CDU 202A) secondary line supply 216.

At block 406, in response to the lead CDUs (e.g., CDU 202A) local facility valve (e.g., facility valve 204A) position open to less than or equal to the lower range, the lead CDU (e.g., CDU 202A), or lead CDU's (e.g., CDU 202A) microcontroller, may decrease the broadcasted flow rate. In an example, the less the facility valve 204 is open, the less load the CDU 202 may be under. In another example, the lead CDU (e.g., CDU 202A), or lead CDU's (e.g., CDU 202A) microcontroller, may store the broadcasted flow rate. In another example, the lead CDU (e.g., CDU 202A), or lead CDU's (e.g., CDU 202A) microcontroller, may adjust broadcasted flow rate based on various factors. Factors may include average differential pressure, the lead CDUs (e.g., CDU 202A) local facility valve (e.g., facility valve 204A) position, and the temperature of the lead CDUs (e.g., CDU 202A) secondary line supply 216.

In an example, once the lead CDU (e.g., CDU 202A), or lead CDU's (e.g., CDU 202A) microcontroller, determines that the lead CDUs (e.g., CDU 202A) local facility valve (e.g., facility valve 204A) position is opened to lesser than or equal to the lower range, the lead CDU (e.g., CDU 202A), or lead CDU's (e.g., CDU 202A) microcontroller, may adjust the broadcasted flow rate to a lesser value. In another example, the lead CDU (e.g., CDU 202A), or lead CDU's (e.g., CDU 202A) microcontroller, may decrease the broadcasted flow rate by an offset value. The lead CDU (e.g., CDU 202A), or lead CDU's (e.g., CDU 202A) microcontroller, may also adjust the lead CDUs (e.g., CDU 202A) flow rate to a level higher than the new broadcasted flow rate. The higher level may be an offset. The offset may be set by the lead CDU (e.g., CDU 202A) or a user. The offset may be a pre-set value. The offset may be a value calculated by the lead CDU (e.g., CDU 202A), or lead CDU's (e.g., CDU 202A) microcontroller, based on various factors, including average differential pressure, the lead CDU (e.g., CDU 202A) local facility valve (e.g., facility valve 204A) position, and the temperature of the lead CDUs (e.g., CDU 202A) secondary line supply 216.

At block 408, in response to an adjustment to the broadcasted flow rate, the lead CDU (e.g., CDU 202A), or lead CDU's (e.g., CDU 202A) microcontroller, may broadcast the new adjusted flow rate (i.e., the new broadcast flow rate). As described above, all CDUs (e.g., CDU 202A) may be communicatively connected. In such examples, the lead CDU (e.g., CDU 202A), or lead CDU's (e.g., CDU 202A) microcontroller, may broadcast the broadcast flow rate at specified intervals. In another example, the lead CDU (e.g., CDU 202A), or lead CDU's (e.g., CDU 202A) microcontroller, may broadcast the broadcasted flow rate any time the flow rate is adjusted. In another example, the lead CDU (e.g., CDU 202A) may broadcast the flow rate at a prompt by a user.

In another example, in response to the lead CDUs (e.g., CDU 202A) local facility valve (e.g., facility valve 204A) position between the upper range and lower range, the lead CDU (e.g., CDU 202A), or lead CDU's (e.g., CDU 202A) microcontroller, may not adjust the broadcasted flow rate. In such examples, the lead CDU (e.g., CDU 202A) may do nothing. In another example, the lead CDU (e.g., CDU 202A), or lead CDU's (e.g., CDU 202A) microcontroller, may adjust the broadcasted flow rate based on other factors, such as average differential pressure and/or the temperature of the lead CDUs (e.g., CDU 202A) secondary line supply 216.

Figure 5:
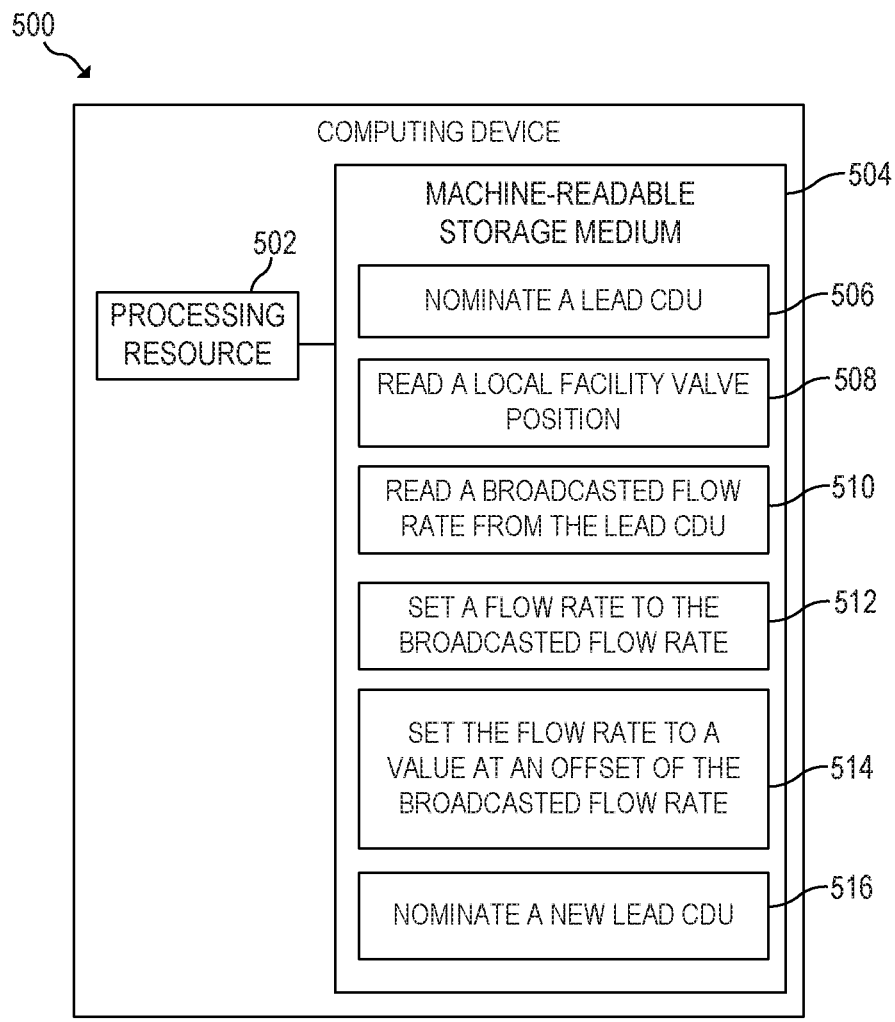
FIG. 5 is a block diagram of a computing device capable of nominating a lead CDU and adjusting a CDU's flow rate based on local facility valve position and broadcasted flow rate.

FIG. 5 is a block diagram of a computing device 500 capable of nominating a lead CDU and adjusting a CDU's flow rate based on local facility valve position and broadcasted flow rate. The computing device 500 may include a processing resource 502 and a machine-readable storage medium 504. The processing resource 502 may execute instructions included in the machine-readable storage medium 504. The machine-readable storage medium 504 of the computing device 500 may include instructions 506 to nominate a lead CDU. In an example, the computing device 500 may be a CDU. The computing device 500 may be connected to a plurality of other computing devices (e.g., a plurality of CDUs). The computing device 500 may nominate any of a plurality of other computing devices to be the lead CDU. The nomination may be performed arbitrarily. In another example, a user may set or nominate the lead CDU. In another example, the computing device 500 may utilize a variety of factors to determine the lead CDU, such as physical location of the computing device 500, user input, number of racks in the configuration, or various other factors.

The machine-readable storage medium 504 of the computing device 500 may include instructions 508 to read a local facility valve position. In an example, the local facility valve position may be open to a certain degree. As described above, the local facility valve may include a sensor. In an example, the sensor may provide the local facility valve position as a percentage. In another example, the computing device 500 may store the local facility valve position in the machine-readable storage medium 504 or some other machine-readable storage medium after the value is read.

The machine-readable storage medium 504 of the computing device 500 may include instructions 510 to read a broadcasted flow rate from the lead computing device. As noted above, the computing device 500 may be connected to other computing devices. One of the connected computing devices may be a lead or leader CDU. The leader CDU may broadcast flow rate for all computing devices to follow. In an example, when the computing device 500 reads the broadcasted flow rate, the computing device 500 may store the broadcasted flow rate in the machine-readable storage medium.

The machine-readable storage medium 504 of the computing device 500 may include instructions 512 to set the computing devices 500 flow rate to the broadcasted flow rate. In response to stable or normal conditions, the computing device 500 may set the computing devices 500 flow rate to the broadcasted flow rate. In another example, the computing device 500 may query the lead CDU for the flow rate and then set the computing devices 500 flow rate to the response from the lead CDU.

The machine-readable storage medium 504 of the computing device 500 may include instructions 514 to set the flow rate to a value at an offset of the broadcasted flow rate. In response to the reading of the local facility valve position being in an upper range, the computing device 500 may set the computing devices 500 flow rate at an offset lower than the broadcast flow rate. In response to the reading of the local facility valve position being in a lower limit, the computing device 500 may set the computing devices 500 flow rate at an offset higher than the broadcast flow rate. In an example the offset may be a constant value. In another example, the offset may be a variable with a set maximum limit. For example, plus or minus fifteen percent. In another example, the computing device 500 may determine the offset to use. In another example, a user may pre-set or alter the offset. In another example, the lead CDU may broadcast the offset to be used in such examples described above.

The machine-readable storage medium 504 of the computing device 500 may include instructions 516 to nominate a new lead CDU in response to a failure of the lead CDU. In an example, the lead CDU may experience a failure. The lead CDU may be taken offline, removed from the system, or no longer be in communication with other CDUs. In such examples, the computing device 500 and the other remaining computing devices may nominate a new lead CDU.

In another example, the computing device 500 may be the lead CDU. In such examples, the computing device 500 may include additional instructions that when executed, set a flow rate to broadcast. In such examples, the computing device 500 may determine the flow rate based on differential pressure, return supply temperature, flow rate, and other factors. In another example, once the flow rate is set the computing device 500 may broadcast the flow rate to other computing devices. In another example, the computing device 500 may adjust the flow rate based on the computing devices 500 own facility valve position. The adjustment may be by an offset, as described above.

Although the flow diagram of FIGS. 3-4 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:

1. A system comprising:
   a plurality of cooling distribution units (CDU's) to control cooling of a plurality of computing devices based in part on average differential pressure between a supply and return for each of the plurality of CDU's, temperature of coolant in a loop flowing between each of the plurality of CDU's and computing devices, and facility valve position for each of the plurality of CDU's,
   wherein one CDU of the plurality of the CDU's is nominated lead CDU by the plurality of CDU's and broadcasts a flow rate to the plurality of CDU's to follow, and
   wherein each CDU of the plurality of CDU's includes the capability to be a lead CDU.

2. The system of claim 1, wherein the lead CDU determines the flow rate based on the average differential pressure between the supply and return for each of the plurality of CDU's.

3. The system of claim 2, wherein the lead CDU adjusts the flow rate, based on a change to the average differential pressure, and broadcasts the adjusted flow rate to the plurality of CDU's.

4. The system of claim 1, wherein each of the plurality of CDU's varies the flow rate as an offset of the broadcasted flow rate.

5. The system of claim 4, wherein the offset is a range set by the lead CDU.

6. The system of claim 5, wherein the range is +/−15% of the broadcasted flow rate.

7. The system of claim 1, wherein each CDU of the plurality of CDU's includes the same control logic.

8. The system of claim 1, wherein in response to a failure of the lead CDU, the plurality of CDU's minus the failed CDU nominate a new lead CDU.

9. The system of claim 1, wherein in response to a CDU's facility valve position in a greater than or equal to 60% open position, the CDU decreases the CDU's flow rate, by an offset percentage, below the broadcasted flow rate.

10. The system of claim 1, wherein in response to a CDU's facility valve position in a less than or equal to 40% open position, the CDU increases the CDU's flow rate, by an offset percentage, above the broadcasted flow rate.

11. A method comprising:
reading, with a cooling distribution unit (CDU), a local facility valve position;
reading, with the CDU, a lead CDU's broadcasted flow rate;
in response to the local facility valve position open to less than or equal to a lower range, increasing, with the CDU, the CDU's flow rate above the lead CDU's broadcasted flow rate;
in response to the local facility valve position open to greater than or equal to an upper range, decreasing, with the CDU, the CDU's flow rate below the lead CDU's broadcasted flow rate; and
in response to the local facility valve position open to less than the upper range and greater than the lower range, setting, with the CDU, the CDU's flow rate to the lead CDU's broadcasted flow rate.

12. The method of claim 11, further comprising:
reading, with the lead CDU, the lead CDU's local facility valve position;
in response to the lead CDU's local facility valve position open to greater than or equal to the upper range, increasing, with the lead CDU's, the lead CDUs broadcasted flow rate;
in response to the lead CDU's local facility valve position open to less than or equal to the lower range, decreasing, with the lead CDU, the lead CDU's broadcasted flow rate; and
in response to an adjustment to the lead CDU's broadcasted flow rate, broadcasting, with the lead CDU, an adjusted flow rate.

13. The method of claim 11, wherein the plurality of CDUs include at least two CDUs.

14. The method of claim 11, wherein the lower range of the local facility valve position is equal to or less than forty percent open.

15. The method of claim 11, wherein the upper range of the local facility valve position is equal to or greater than sixty percent open.

16. The method of claim 11, wherein the lead CDU sets the lead CDU's flow rate to a value different than the lead CDU's broadcasted flow rate to maintain average differential pressure.

17. A non-transitory machine-readable storage medium encoded with instructions executable by a processor, the non-transitory machine-readable storage medium comprising, instructions to:
nominate one CDU of a plurality of CDU's to lead CDU by the plurality of CDU's, wherein each CDU of the plurality of CDU's includes the capability to be a lead CDU;
read a local facility valve position;
read a broadcasted flow rate from the lead CDU;
set a flow rate to the broadcasted flow rate;
in response to a reading of the local facility valve position passing an upper limit, set the flow rate to a value at an offset lower than the broadcasted flow rate;
in response to the reading of the local facility valve position passing a lower limit, set the flow rate to a value at an offset higher than the broadcasted flow rate; and
in response to a failure of the lead CDU, nominate a new lead CDU from the plurality of CDU's minus the failed CDU.

18. The non-transitory machine-readable storage medium of claim 17, further including instructions to:
in response to the nomination to the lead CDU, set the broadcast flow rate based in part on average differential pressure and a secondary loop coolant temperature.

19. The non-transitory machine-readable storage medium of claim 18, further including instructions to:
broadcast to the plurality of CDU's the broadcasted flow rate.

20. The non-transitory machine-readable storage medium of claim 17, wherein the upper limit is a 60% open position and the lower limit is a 40% open position.

* * * * *